United States Patent
Tian et al.

(10) Patent No.: US 11,506,948 B2
(45) Date of Patent: Nov. 22, 2022

(54) ARRAY SUBSTRATE AND MANUFACTURING METHOD THEREOF, DISPLAY PANEL AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Maokun Tian, Beijing (CN); Zhonghao Huang, Beijing (CN); Xu Wu, Beijing (CN); Yuanyao Dou, Beijing (CN)

(73) Assignees: CHONGQING BOE OPTOELECTRONICS TECHNOLOGY CO., LTD., Chongqing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 216 days.

(21) Appl. No.: 16/619,249

(22) PCT Filed: May 22, 2019

(86) PCT No.: PCT/CN2019/087994
§ 371 (c)(1),
(2) Date: Dec. 4, 2019

(87) PCT Pub. No.: WO2020/140366
PCT Pub. Date: Jul. 9, 2020

(65) Prior Publication Data
US 2021/0333667 A1 Oct. 28, 2021

(30) Foreign Application Priority Data
Jan. 4, 2019 (CN) .......................... 201910008051.1

(51) Int. Cl.
*G02F 1/1343* (2006.01)
*G02F 1/1368* (2006.01)
(Continued)

(52) U.S. Cl.
CPC ...... *G02F 1/136227* (2013.01); *G02F 1/1368* (2013.01); *G02F 1/13439* (2013.01);
(Continued)

(58) Field of Classification Search
CPC ............ G02F 1/134363; G02F 1/1368; G02F 1/134372; G02F 1/136227; G02F 1/1333;
(Continued)

(56) References Cited

U.S. PATENT DOCUMENTS 7,573,556 B2 8/2009 Yoo et al.
9,638,971 B2 * 5/2017 Komatsu .......... G02F 1/134363
(Continued)

FOREIGN PATENT DOCUMENTS

CN 103499906 A 1/2014
CN 104882453 A 9/2015
(Continued)

OTHER PUBLICATIONS

International Search Report dated Oct. 8, 2019, issued in counterpart application No. PCT/CN2019/087994 (11 pages).
(Continued)

*Primary Examiner* — Thoi V Duong
(74) *Attorney, Agent, or Firm* — WHDA, LLP

(57) ABSTRACT

The disclosure relates to an array substrate. The array substrate may include a base substrate, an auxiliary electrode, a thin film transistor, a first insulating layer, a first electrode, a second insulating layer, and a second electrode sequentially arranged in a direction away from the base substrate. The auxiliary electrode is between the first insulating layer and the second insulating layer and insulated
(Continued)

from the first electrode, the auxiliary electrode is coupled to a drain of the thin film transistor through a first via hole in the first insulating layer, and the second electrode is coupled to the auxiliary electrode through a second via hole in the second insulating layer.

14 Claims, 12 Drawing Sheets

(51) Int. Cl.
  *G02F 1/1362* (2006.01)
  *G02F 1/1333* (2006.01)
  *H01L 27/12* (2006.01)

(52) U.S. Cl.
  CPC ...... *G02F 1/134309* (2013.01); *H01L 27/124* (2013.01); *H01L 27/1248* (2013.01); *H01L 27/1259* (2013.01); *G02F 2201/40* (2013.01)

(58) Field of Classification Search
  CPC ......... G02F 1/133357; G02F 1/133345; G02F 1/134309; G02F 1/13439; G02F 1/134318; G02F 1/1343; G02F 1/1362; G02F 2201/121; G02F 2201/40; H01L 27/124; H01L 27/1248; H01L 27/1259
  See application file for complete search history.

(56) References Cited

U.S. PATENT DOCUMENTS

| | | |
|---|---|---|
| 2016/0365363 A1 | 12/2016 | Shi |
| 2017/0010497 A1* | 1/2017 | Kim .................. G02F 1/134309 |
| 2017/0351129 A1* | 12/2017 | Morimoto ......... G02F 1/133345 |
| 2019/0057977 A1 | 2/2019 | Ren et al. |
| 2019/0212853 A1 | 7/2019 | Ma et al. |
| 2019/0227393 A1 | 7/2019 | Gui et al. |
| 2021/0036031 A1* | 2/2021 | Nakamura ............ G02F 1/1345 |

FOREIGN PATENT DOCUMENTS

| | | |
|---|---|---|
| CN | 106098710 A | 11/2016 |
| CN | 106935597 A | 7/2017 |
| CN | 206741462 U | 12/2017 |
| CN | 107957822 A | 4/2018 |
| CN | 108628046 A | 10/2018 |
| CN | 109671726 A | 4/2019 |
| KR | 2005-0048791 A | 5/2005 |

OTHER PUBLICATIONS

Office Action dated Aug. 28, 2020, issued in counterpart CN Application No. 201910008051.1, with English Translation. (17 pages).

Office Action dated Jun. 12, 2020, issued in counterpart CN application No. 201910008051.1, with English translation. (15 pages).

* cited by examiner

ARRAY SUBSTRATE AND MANUFACTURING METHOD THEREOF, DISPLAY PANEL AND DISPLAY APPARATUS

CROSS-REFERENCE TO RELATED APPLICATIONS

This application claims benefit of the filing date of Chinese Patent Application No. 201910008051.1 filed on Jan. 4, 2019, the disclosure of which is hereby incorporated in its entirety by reference.

TECHNICAL FIELD

The present application relates to the field of display technologies, and in particular, to an array substrate, a manufacturing method thereof, a display panel, and a display apparatus.

BACKGROUND

A liquid crystal display panel is a common display panel. The array substrate in the liquid crystal display panel includes: a base substrate, and a thin film transistor (TFT), a first insulating layer, a common electrode, a second insulating layer and a pixel electrode arranged sequentially in a direction away from the base substrate.

In the related art, the pixel electrode is coupled to the drain of the TFT through an via hole in the second insulating layer, a via hole in the common electrode, and a via hole in the first insulating layer. In addition, in order to enable the pixel electrode to be coupled to the drain after passing through the via holes, the orthogonal projection of the drain on the base substrate is large.

BRIEF SUMMARY

An embodiment of the present disclosure provides an array substrate. The array substrate may include a base substrate, an auxiliary electrode, a thin film transistor, a first insulating layer, a first electrode, a second insulating layer, and a second electrode sequentially arranged in a direction away from the base substrate. The auxiliary electrode is between the first insulating layer and the second insulating layer and insulated from the first electrode, the auxiliary electrode is coupled to a drain of the thin film transistor through a first via hole in the first insulating layer, and the second electrode is coupled to the auxiliary electrode through a second via hole in the second insulating layer.

Optionally, the first electrode is a common electrode, and the second electrode is a pixel electrode.

Optionally, orthographic projection of the first via hole on the base substrate overlaps orthographic projection of the drain of the thin film transistor on the base substrate, and orthographic projection of the second via hole on the base substrate overlaps orthographic projection of the auxiliary electrode on the base substrate.

Optionally, the first insulating layer comprises an inorganic insulating layer and an organic insulating layer sequentially arranged in a direction away from the thin film transistor. The organic insulating layer comprises an organic layer via hole, the inorganic insulating layer comprises an inorganic layer via hole, the organic layer via hole is connected with the inorganic layer via hole, and both the organic layer via hole and the inorganic layer via hole constitute the first via hole.

Optionally, a thickness of the organic insulating layer is larger than a thickness of the inorganic insulating layer in a direction perpendicular to the base substrate.

Optionally, the common electrode and the auxiliary electrode are in a same layer and made of a same material.

Optionally, the common electrode comprises a hollowed out region, and the orthographic projection of the auxiliary electrode on the base substrate is within orthographic projection of the hollowed out region on the base substrate.

Optionally, the orthographic projection of the auxiliary electrode on the base substrate has a shape of a first rectangle, and the orthographic projection of the hollowed out region on the base substrate has a shape of a second rectangle.

Optionally, the orthographic projection of the second via hole on the base substrate comprises an area outside the orthographic projection of the first via hole on the base substrate.

Optionally, the orthogonal projection of the second via hole on the base substrate further comprises the orthographic projection of the first via hole on the base substrate.

Optionally, the orthographic projection of the second via hole on the base substrate further comprises an area in orthographic projection of a target sidewall on the base substrate, the target sidewall being a sidewall of the first via hole adjacent to the second via hole.

Optionally, the pixel electrode is further coupled to a portion of the auxiliary electrode on the target sidewall through the second via hole.

Optionally, the orthogonal projection of the second via hole on the base substrate does not overlap the orthographic projection of the first via hole on the base substrate.

One example of the present disclosure is a method of fabricating an array substrate. The method of fabricating the array substrate may include forming a thin film transistor on the base substrate; forming a first insulating layer having a first via hole on the base substrate on which the thin film transistor was formed, orthographic projection of the first via hole on the base substrate overlapping orthographic projection of a drain of the thin film transistor on the base substrate; forming a common electrode and an auxiliary electrode insulated from each other on the base substrate on which the first insulating layer was formed, the auxiliary electrode being coupled to the drain through the first via hole; forming a second insulating layer having a second via hole on the base substrate on which the common electrode and the auxiliary electrode were formed, orthographic projection of the second via hole on the base substrate overlapping orthographic projection of the auxiliary electrode on the base substrate; and forming a pixel electrode on the base substrate on which the second insulating layer was formed, the pixel electrode being coupled to the auxiliary electrode through the second via hole.

Optionally, forming the first insulating layer having the first via hole on the base substrate on which the thin film transistor was formed comprises forming an inorganic insulating material layer and an organic insulating material layer sequentially on the base substrate on which the thin film transistor was formed; patterning the organic insulating material layer to obtain an organic insulating layer having an organic layer via hole; patterning the inorganic insulating material layer to obtain an inorganic insulating layer having an inorganic layer via hole, and the organic layer via hole is connected with the inorganic layer via hole, thereby forming the first via hole.

Optionally, patterning the inorganic insulating material layer is performed by using the organic insulating layer as a mask.

Optionally, forming the common electrode and the auxiliary electrode insulated from each other on the base substrate on which the first insulating layer was formed comprises forming a conductive material layer on the base substrate on which the first insulating layer was formed; and patterning the conductive material layer to obtain an electrode pattern, the electrode pattern comprising the common electrode and the auxiliary electrode.

One example of the present disclosure is a display panel, comprising the array substrate according to one embodiment of the present disclosure.

One example of the present disclosure is a display apparatus, comprising the display panel according to one embodiment of the present disclosure.

BRIEF DESCRIPTION OF THE DRAWINGS

In order to more clearly illustrate the technical solutions in the embodiments of the present disclosure, the drawings used in the description of the embodiments will be briefly described below. It is obvious that the drawings in the following description are only some embodiments of the present application. Other drawings may also be obtained by those skilled in the art from these drawings without paying for creative labor.

DETAILED DESCRIPTION

Figure 1:
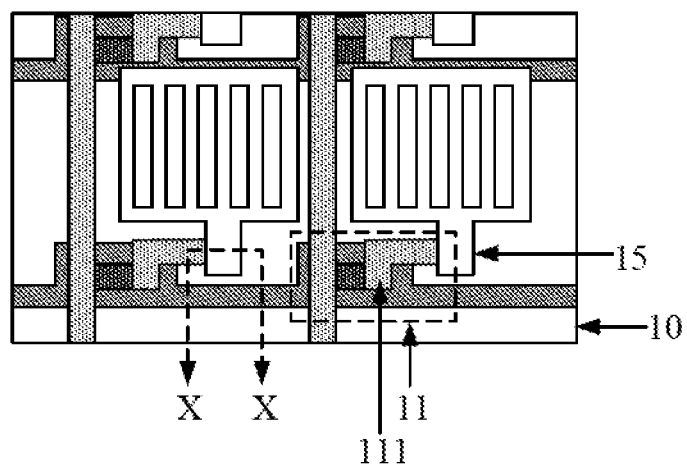
FIG. 1 is a top view of an array substrate provided by the related art.

Exemplary embodiments will now be described more fully with reference to the accompanying drawings. However, the exemplary embodiments can be embodied in a variety of forms and should not be construed as being limited to the embodiments set forth herein. On the contrary, those embodiments provided make the disclosure comprehensive and complete and convey all the ideas of the exemplary embodiments to those skilled in the art. The described features, structures, or characteristics may be combined in any suitable manner in one or more embodiments. In the following description, numerous specific details are set forth and provide the full understanding of the embodiments of the present disclosure. However, one skilled in the art will appreciate that the technical solution of the present disclosure may be practiced without one or more of the specific details, or may employ other methods, components, materials, apparatuses, steps, etc. In other instances, well-known technical solutions are not shown or described in detail to avoid obscuring aspects of the present disclosure.

In addition, the drawings are merely schematic illustrations of the present disclosure, and are not necessarily drawn to scale. The same reference numerals in the drawings denote the same or similar parts, and the repeated description thereof will be omitted.

Figure 2:
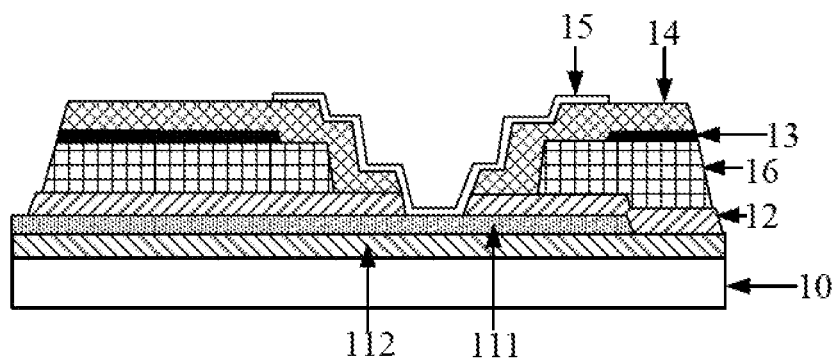
FIG. 2 is a schematic view of section XX of FIG. 1.

FIG. 1 is a top view of an array substrate provided in the related art, and FIG. is a schematic view of a section XX in FIG. 1. It should be noted that only a part of the structure in FIG. 2 is shown in FIG. 1. As shown in FIG. 1 and FIG. 2, the array substrate may include: a base substrate 10, and a thin film transistor 11, a first insulating layer 12, a common electrode 13, a second insulating layer 14 and a pixel electrode 15 which are sequentially arranged in a direction away from the base substrate. The thin film transistor 11 may include a gate electrode, a gate-insulating layer 112, an active layer, a source and a drain 111. Only the drain 111 and the gate-insulating layer 112 are shown in FIG. 2.

The common electrode 13 includes a first via hole (not shown in FIG. 2). The second insulating layer 14 extends into the first via hole, and the region extending into the first via hole includes a second via hole (not shown in FIG. 2). The first insulating layer 12 has a third via hole which is connected with the drain 111 of the thin film transistor 11 and the second via hole. The pixel electrode 15 is electrically coupled to the drain 111 of the thin film transistor 11 through the first via hole, the second via hole, and the third via hole.

It should be noted that when two electrodes on the base substrate are coupled through the via holes, in order to ensure the effective connection of the two electrodes, it is generally required that orthographic projection of the via holes through which the two electrodes are coupled on the base substrate and orthographic projection of one of the two electrodes adjacent to the base substrate on the base substrate overlap. Therefore, in order to ensure effective connection between the drain and the pixel electrode, the orthographic projection of the first via hole, the second via hole and the third via hole on the base substrate are all located within the orthographic projection of the drain 111 of the thin film transistor on the base substrate 10 in the related art. At this time, the orthographic projection of the drain on the base substrate is restricted by a large number of via holes, the orthogonal projection of the drain 111 on the base substrate 10 is large. Since the orthogonal projection of the drain on the base substrate, which is negatively correlated with the pixel aperture ratio of the liquid crystal display panel, is large, the pixel aperture ratio of the liquid crystal display panel is small.

One embodiment of the present disclosure provides an array substrate and a manufacturing method thereof, a display panel in which the array substrate is located, and a display apparatus in which the display panel is located. The pixel aperture ratio of the display panel is relatively small. The array substrate, the manufacturing method thereof, the display panel and the display apparatus provided by the embodiments of the present disclosure will be explained below.

Figure 3:
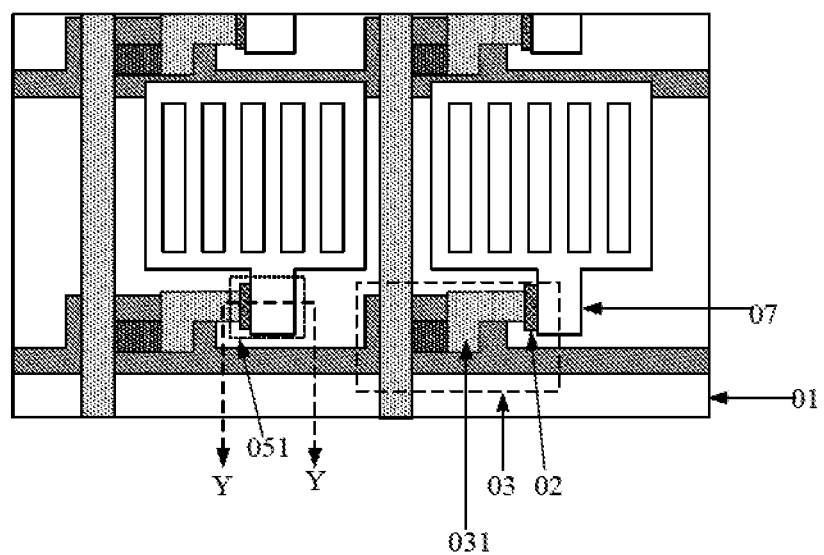
FIG. 3 is a top view of an array substrate according to one embodiment of the present disclosure.
Figure 4:
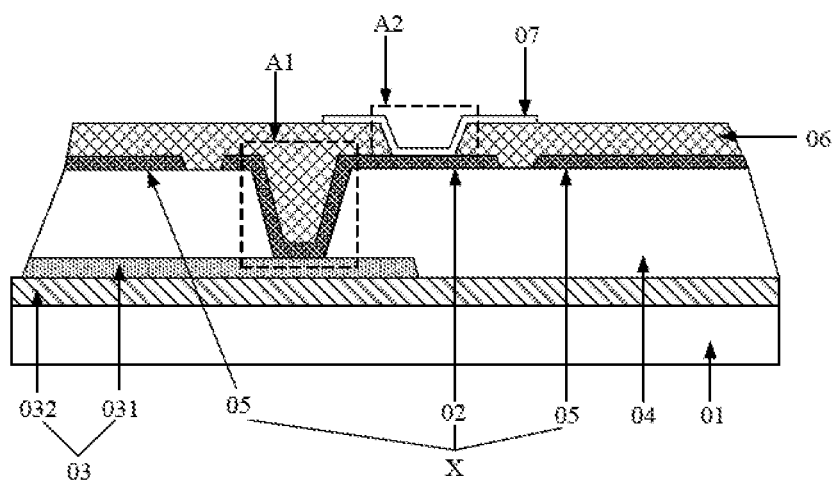
FIG. 4 is a schematic view of a section YY of FIG. 3.

FIG. 3 is a top view of an array substrate according to one embodiment of the present disclosure, and FIG. 4 is a schematic view of a section YY of FIG. 3. It should be noted that only a part of the structure of FIG. 4 is showed in FIG. 3. As shown in FIG. 3 and FIG. 4, the array substrate may include: a base substrate 01 and an auxiliary electrode 02, and a thin film transistor 03, a first insulating layer 04, a common electrode 05, a second insulating layer 06 and a pixel electrode 07 which are sequentially arranged in a direction away from the base substrate 01.

The first insulating layer 04 has a first via hole A1, and the orthographic projection of the first via hole A1 on the base substrate 01 overlaps with the orthographic projection of the drain 031 of the thin film transistor 03 on the base substrate 01. The second insulating layer 06 has a second via hole A2, and the orthographic projection of the second via hole A2 on the base substrate 01 overlaps with the orthographic projection of the auxiliary electrode 02 on the base substrate 01.

The auxiliary electrode 02 is located between the first insulating layer 04 and the second insulating layer 06, and insulated from the common electrode 05. The auxiliary electrode 02 is coupled to the drain 031 through the first via hole A1. The pixel electrode 07 is coupled to the auxiliary electrode 02 through the second via hole A2.

In the array substrate provided by some embodiments of the present disclosure, the electrode coupled to the drain is an auxiliary electrode, and the auxiliary electrode is coupled to the drain through the first via hole in the first insulating layer. At this time, the auxiliary electrode is coupled to the drain only through fewer via holes (for example, only the first via hole). Therefore, since the orthographic projection of the drain on the base substrate is restricted by fewer via holes, the orthographic projection of the drain on the base substrate can be smaller. Accordingly, the aperture ratio of the sub-pixel structure in the display panel where the array substrate is located is larger.

In one embodiment, the thin film transistor 03 may include a gate electrode, a gate insulating layer 032, an active layer, a source and a drain 031. Only the drain 031 and the gate insulating layer 032 in the thin film transistor 03 are shown in FIG. 4. The thin film transistor 03 can be an amorphous silicon thin film transistor, a low temperature polysilicon thin film transistor, or an indium gallium zinc oxide transistor, or other types of thin film transistors, which are not limited in the embodiment of the present disclosure.

In one embodiment, the common electrode 05 and the auxiliary electrode 02 are between the first insulating layer 04 and the second insulating layer 06. The common electrode 05 and the auxiliary electrode 02 can be formed in the same layer (for example, obtained by performing one patterning process on a layer of a certain electrode material), or they may be separately formed. In one embodiment, when the common electrode 05 is formed in the same layer as the auxiliary electrode 02, as shown in FIG. 3 and FIG. 4, the array substrate may include an electrode pattern X, which includes the common electrode 05 and the auxiliary electrode 02. When the common electrode 05 and the auxiliary electrode 02 are formed in the same layer, the process of manufacturing the common electrode 05 and the auxiliary electrode 02 is simple, and the efficiency of manufacturing the common electrode 05 and the auxiliary electrode 02 is high.

Optionally, as shown in FIG. 3 and FIG. 4, the common electrode 05 has a hollowed out region 051. Orthographic projection of the auxiliary electrode 02 on the base substrate 01 is located within orthographic projection of the hollowed out region 051 on the base substrate 01. That is, the common electrode 05 surrounds the auxiliary electrode 02, and the common electrode 05 and the auxiliary electrode 02 have an annular spacer region therebetween. Optionally, the common electrode 05 may not have the hollowed out region 051, and the common electrode 05 may not surround the auxiliary electrode 02. In one embodiment, the common electrode 05 and the auxiliary electrode 02 are sequentially arranged in a direction parallel to the base substrate 01, which is not limited in the embodiment of the present disclosure.

Optionally, as shown in FIG. 3 and FIG. 4, the orthographic projection of the auxiliary electrode 02 on the base substrate 01 is a first rectangle, and the orthographic projection of the hollowed out region 051 on the base substrate 01 is a second rectangle. In one embodiment, the first rectangle and the second rectangle may be similar patterns. That is, a length to width ratio of the first rectangle and a length to width ratio of the second rectangle are the same. In one embodiment, the lengths and widths of the first rectangle are the same as the lengths and widths of the second rectangle, respectively.

Optionally, the orthographic projection of the auxiliary electrode 02 on the base substrate 01 may not be rectangular (for example, may be circular or the like). The orthographic projection of the hollowed out region 051 on the base substrate 01 may not be rectangular (for example, may be triangle or the like). The shapes of the orthographic projection of the auxiliary electrode and the hollowed out region on the base substrate are not limited in the embodiments of the present disclosure.

Optionally, the orthographic projection of the second via hole A2 on the base substrate 01 may be entirely outside the orthographic projection of the first via hole A1 on the base substrate 01. At this time, there is no correlation between the orthographic projection of the first via hole A1 on the base substrate 01 and the orthographic projection of the second via hole A2 on the base substrate 01. In this case, the first via hole A1 may be set smaller, and the corresponding orthographic projection of the drain on the base substrate 01 may be set smaller. Accordingly, the aperture ratio of the sub-pixel structure in the display panel comprising the array substrate is larger.

Optionally, the orthographic projection of the second via hole A2 on the base substrate 01 may partially overlap the orthographic projection of the drain 031 on the base substrate 01. Optionally, the orthographic projection of the second via hole A2 on the base substrate 01 may be located outside the orthographic projection of the drain 031 on the base substrate 01, which is not limited in the embodiment of the present disclosure.

Optionally, the orthographic projection of the first via hole A1 on the base substrate 01 is located within the orthographic projection of the drain 031 of the thin film transistor 03 on the base substrate 01. The orthographic projection of the second via hole A2 on the base substrate 01 is located within the orthographic projection of the auxiliary electrode 02 on the base substrate 01. Optionally, only a partial region of the orthographic projection of the first via hole A1 on the base substrate 01 is located within the orthographic projection of the drain 031 on the base substrate 01, and only a partial region of the orthographic projection of the second via hole A2 on the base substrate 01 is located within the orthographic projection of the auxiliary electrode 02 on the base substrate 01.

Further, the first insulating layer 04 may be referred to as a passivation layer. The first insulating layer 04 in the array substrate may include one insulating layer, as shown in FIG. 3. Optionally, the first insulating layer 04 may include a plurality of superposed insulating layers. Wherein, the plurality of insulating layers may be all organic insulating layers, all inorganic insulating layers, or a combination of organic insulating layers and inorganic insulating layers, which is not limited in this embodiment of the present disclosure.

Figure 5:
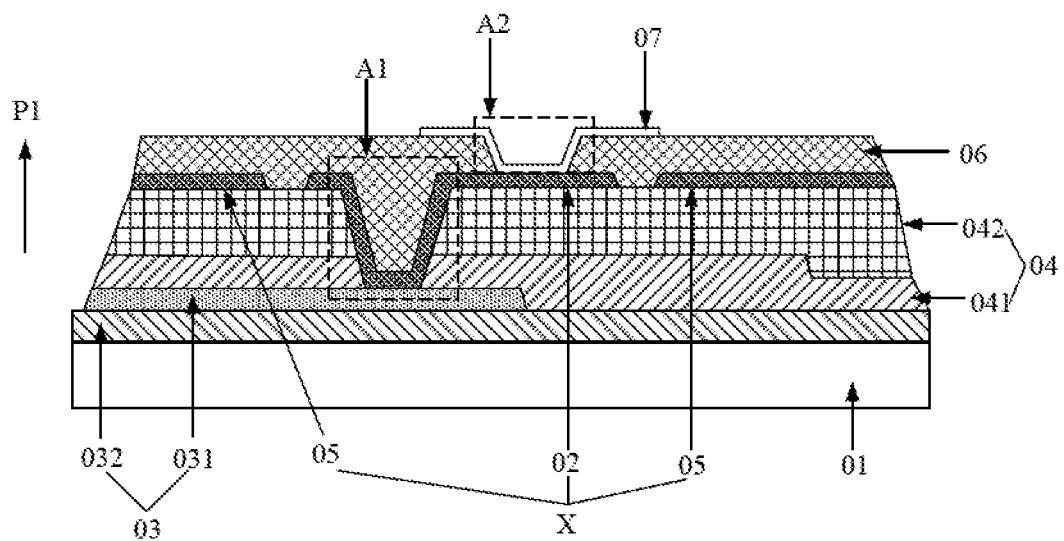
FIG. 5 is a schematic structural diagram of an array substrate according to one embodiment of the present disclosure.

Optionally, FIG. 5 is a schematic structural diagram of an array substrate according to one embodiment of the present disclosure. FIG. 5 schematically shows a cross section of the array substrate perpendicular to the base substrate. In FIG. 5, the first insulating layer 04 is composed of an inorganic insulating layer and an organic insulating layer as an example. As shown in FIG. 5, on the basis of FIG. 4, the first insulating layer 04 may include an inorganic insulating layer 041 and an organic insulating layer 042 which are sequentially arranged in a direction away from the thin film transistor 03. Furthermore, the organic insulating layer 042 has an organic layer via hole, the inorganic insulating layer 041 has an inorganic layer via hole. The organic layer via hole is connected with the inorganic layer via hole. Both the organic layer via hole and the inorganic layer via hole constitute the first via hole A1.

Optionally, the inorganic insulating layer 041 may be made of silicon dioxide, the organic insulating layer 042 may be made of a resin, and the second insulating layer 06 may be made of silicon nitride. The inorganic insulating layer 041 may also be made of other inorganic insulating materials such as silicon nitride, sulfur, asbestos, etc. The organic insulating layer 042 may also be made of other organic insulating materials such as rubber, etc. The second insulating layer 06 may also be made of other insulating materials such as resin, sulfur, asbestos, rubber, silica, etc.

It should be noted that the common electrode 05 is insulated from the thin film transistor 03 by the first insulating layer 04, and a parasitic capacitance (not shown in FIG. 5) is formed between the common electrode 05 and the thin film transistor 03. When the first insulating layer 04 is composed of two insulating layers, that is, the inorganic insulating layer 041 and the organic insulating layer 042, the first insulating layer 04 is thick. At this time, the parasitic capacitance between the common electrode 05 and the thin film transistor 03 is small. Accordingly, the thin film transistor 03 is less affected by the parasitic capacitance during operation.

Optionally, as shown in FIG. 5, in a direction P1 perpendicular to the base substrate 01, a thickness of the organic insulating layer 042 (eg, 2.5 micrometers) is greater than a thickness of the inorganic insulating layer 041. It should be noted that, generally, when the thickness is large, the organic insulating material is more transparent than the inorganic insulating material. Therefore, the thickness of the organic insulating layer 042 is set larger than the thickness of the inorganic insulating layer 041, so that the transparency of the entire first insulating layer 04 is higher. Accordingly, the blocking rate to light by the first insulating layer 04 is lower, and the brightness of the display panel where the first insulating layer 04 is used is higher. In one embodiment, the thickness of the organic insulating layer 042 may be less than or equal to the thickness of the inorganic insulating layer 041, which is not limited in the embodiment of the present disclosure.

Optionally, the orthographic projection of the second via hole A2 on the base substrate 01 is outside the orthographic projection of the first via hole A1 on the base substrate 01. In the embodiment, all the orthographic projection of the second via hole A2 on the base substrate 01 is located outside the orthographic projection of the first via hole A1 on the base substrate 01. Optionally, the orthographic projection of the second via hole A2 on the base substrate 01 may also be partially located outside the orthographic projection of the first via hole A1 on the base substrate 01.

Figure 6A:
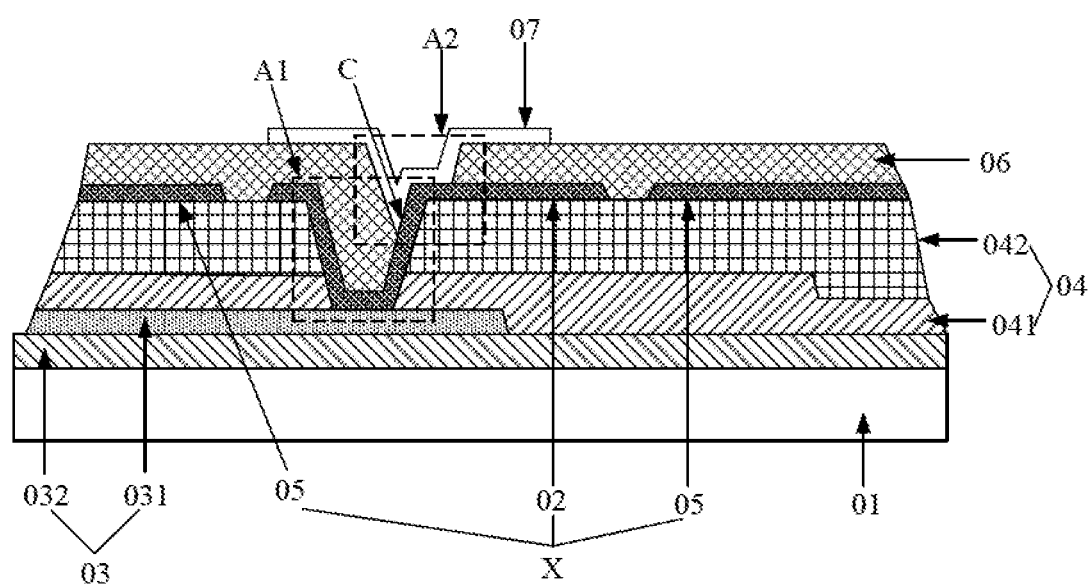
FIG. 6A is a schematic structural diagram of an array substrate according to one embodiment of the present disclosure.

FIG. 6A is a schematic structural diagram of an array substrate according to one embodiment of the present disclosure. As shown in FIG. 6A, a sidewall of the first via hole A1 adjacent to the second via hole A2 is referred as a target sidewall C. On the basis of FIG. 5, the orthographic projection of the second via hole A2 on the base substrate 01 includes not only the region outside the orthographic projection of the first via hole A1 on the base substrate 01, but also a region located within the orthographic projection of the target sidewall C on the base substrate 01. At this time, the pixel electrode 07 is coupled not only to the portion of the auxiliary electrode 02 outside the first via hole A1, but also to the portion of the auxiliary electrode 02 located on the target side wall C through the second via hole A2.

Figure 6B:
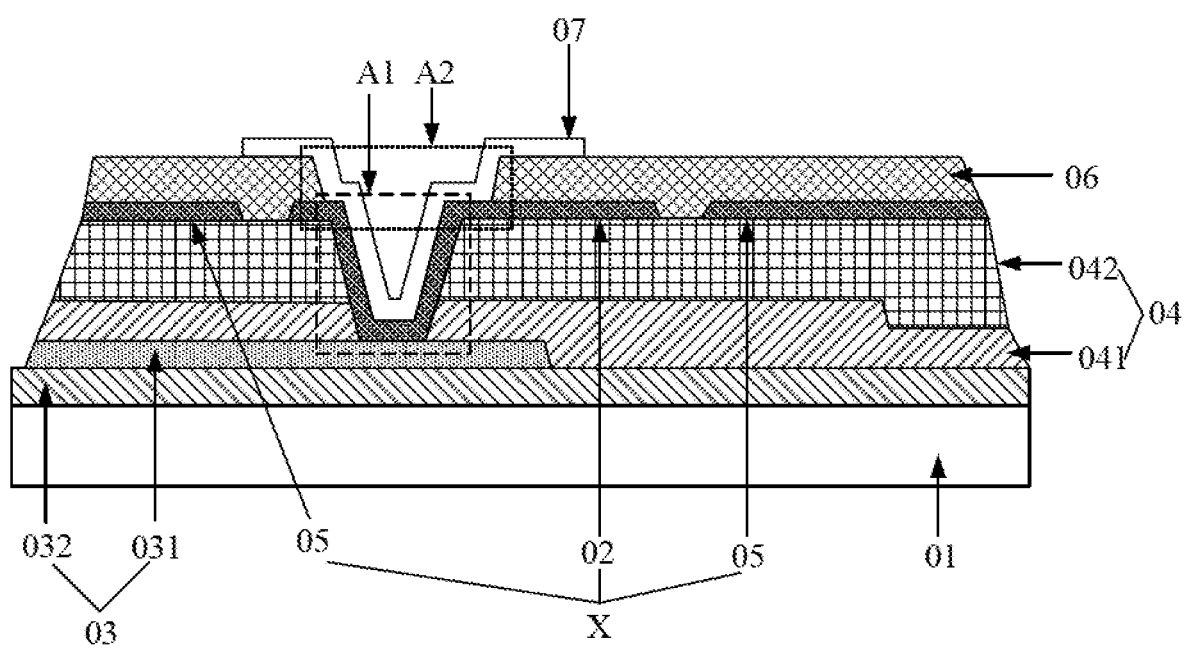
FIG. 6B is a schematic structural diagram of an array substrate according to one embodiment of the present disclosure.

FIG. 6B is a schematic structural diagram of an array substrate according to one embodiment of the present disclosure. As shown in FIG. 6B, on the basis of FIG. 5, the orthographic projection of the second via hole A2 on the base substrate 01 includes not only an area outside the orthographic projection of the first via hole A1 on the base substrate 01, but also the orthographic projection of the first via hole A1 on the base substrate 01. At this time, the pixel electrode 07 is coupled not only to the portion of the auxiliary electrode 02 outside the first via hole A1, but also to the portion of the auxiliary electrode 02 located inside the first via hole A1 through the second via hole A2.

Optionally, based on the array substrate shown in FIG. 4, the position of the second via hole in FIG. 4 can also be adjusted with reference to the position of the second via hole shown in FIG. 6A or FIG. 6B, so that the orthographic projection of the second via hole on the base substrate is partially located outside the orthographic projection of the first via hole on the base substrate.

Optionally, the orthographic projection of the second via hole A2 on the base substrate 01 in FIG. 4 and FIG. 5 may not include an area outside the orthographic projection of the first via hole A1 on the base substrate 01. Rather, the orthographic projection of the second via A2 on the base substrate 01 are all located within the orthographic projection of the first via A1 on the base substrate 01.

In the array substrate provided by some embodiments of the present disclosure, the electrode coupled to the drain is an auxiliary electrode, and the auxiliary electrode is coupled to the drain through the first via hole in the first insulating layer. At this time, the auxiliary electrode is only coupled to the drain through fewer via holes (eg, only the first via hole). Therefore, the orthographic projection of the drain on the base substrate is restricted by fewer via holes, and the orthographic projection of the drain on the base substrate can be relatively smaller. Accordingly, the aperture ratio of the sub-pixel structure in the display panel where the array substrate is located is large.

In addition, in the array substrate of the related art shown in FIG. 1 and FIG. 2, the orthographic projection of the second via hole in the second insulating layer 14 on the base substrate and the orthographic projection of the third via hole in the first insulating layer 12 on the base substrate are both located within the orthographic projection of the first via hole in the common electrode 13 on the base substrate. That is, the orthographic projections of these via holes on the base substrate have a nested relationship. In the related art, in order to reduce the pixel aperture ratio as much as possible, it is necessary to reduce the orthographic projection of the drain 111 on the base substrate 10 as much as possible. Accordingly, the orthographic projection of each of the via holes on the base substrate should be reduced as much as possible. However, after reducing the orthographic projection of the via holes on the base substrate, the connection area between the third via hole (a small via hole) and the drain is small. Accordingly, the pixel electrode cannot be effectively coupled to the drain through the third via hole, and the contact resistance between the pixel electrode and the drain is large.

However, in the array substrate provided by some embodiments of the present disclosure, the pixel electrode is coupled to the auxiliary electrode through the second via hole, and the auxiliary electrode is coupled to the drain through the first via hole. When the orthographic projection of the second via hole on the base substrate and the orthographic projection of the first via hole on the base substrate do not have a nested relationship, the first via hole and the second via hole may be larger. In this way, the contact area between the pixel electrode and the auxiliary electrode is larger, and the contact area between the auxiliary electrode and the drain is also larger. Accordingly, the contact resistance between the pixel electrode and the auxiliary electrode is small, and the contact resistance between the auxiliary electrode and the drain is also small, and finally, the contact resistance between the pixel electrode and the drain is small.

Figure 7:
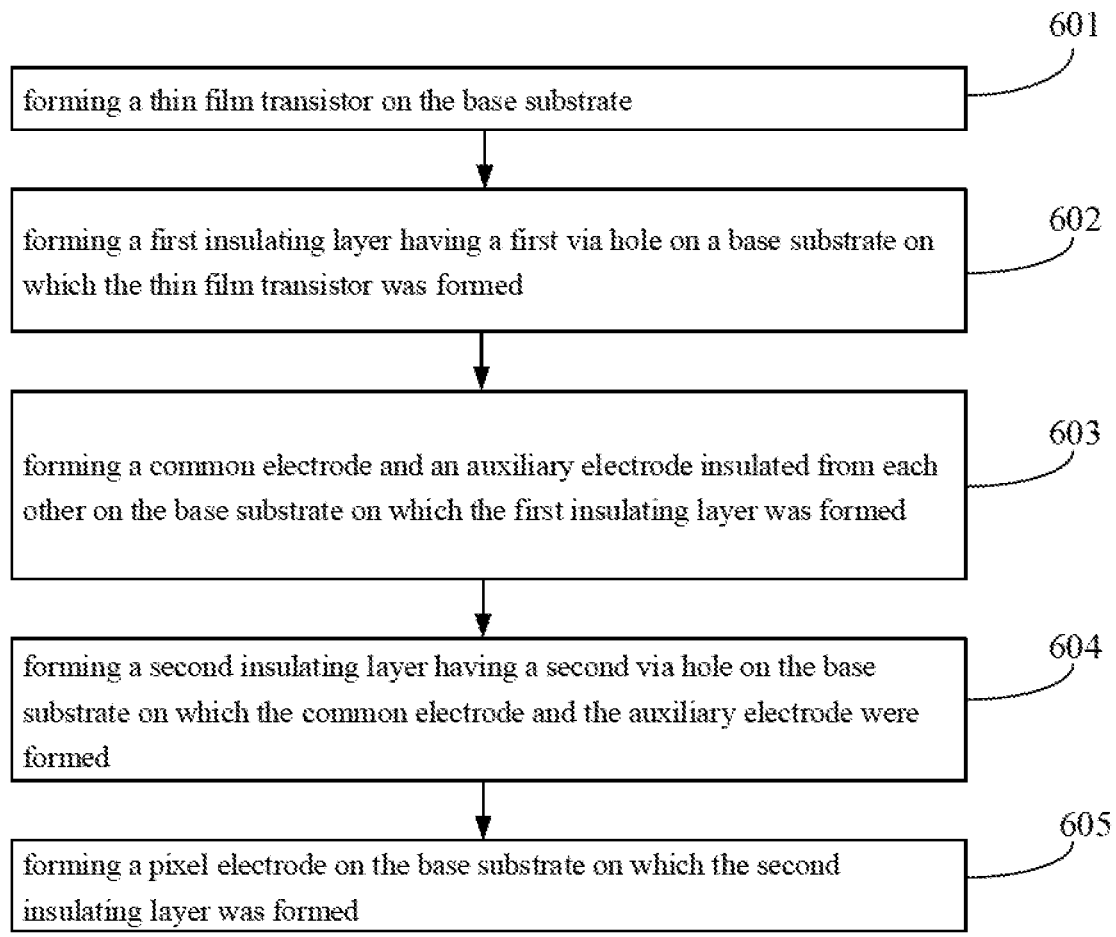
FIG. 7 is a flowchart of a method for manufacturing an array substrate according to one embodiment of the present disclosure.

FIG. 7 is a flowchart of a method for fabricating an array substrate according to one embodiment of the present disclosure. The method for fabricating the array substrate can be used to fabricate the array substrate shown in any of FIG. 3, FIG. 4. FIG. 6, FIG. 6A, and FIG. 6B. As shown in FIG. 7, the manufacturing method of the array substrate may include Steps 601-605:

Step 601 includes forming a thin film transistor on the base substrate.

Step 602 includes forming a first insulating layer having a first via hole on a base substrate on which the thin film transistor was formed, and the orthographic projection of the first via hole on the base substrate overlaps with the orthographic projection of the drain of the thin film transistor on the base substrate.

Step 603 includes forming a common electrode and an auxiliary electrode insulated from each other on the base substrate on which the first insulating layer was formed, and the auxiliary electrode is coupled to the drain through the first via hole.

Step 604 includes forming a second insulating layer having a second via hole on the base substrate on which the common electrode and the auxiliary electrode were formed, and the orthographic projection of the second via hole on the base substrate overlaps with the orthographic projection of the auxiliary electrode on the base substrate.

Step 605 includes forming a pixel electrode on the base substrate on which the second insulating layer was formed, and the pixel electrode is coupled to the auxiliary electrode through the second via hole.

Optionally, in the array substrate manufactured by the method provided by one embodiment of the present disclosure, the electrode coupled to the drain is an auxiliary electrode, and the auxiliary electrode is coupled to the drain through the first via hole in the first insulating layer. At this time, the auxiliary electrode is coupled to the drain only through fewer via holes (eg, only the first via hole). Therefore, the orthographic projection of the drain on the base substrate is restricted by fewer via holes, and the orthographic projection of the drain on the base substrate can be small. Accordingly, the aperture ratio of the sub-pixel structure in the display panel where the array substrate is located is large.

Figure 8:
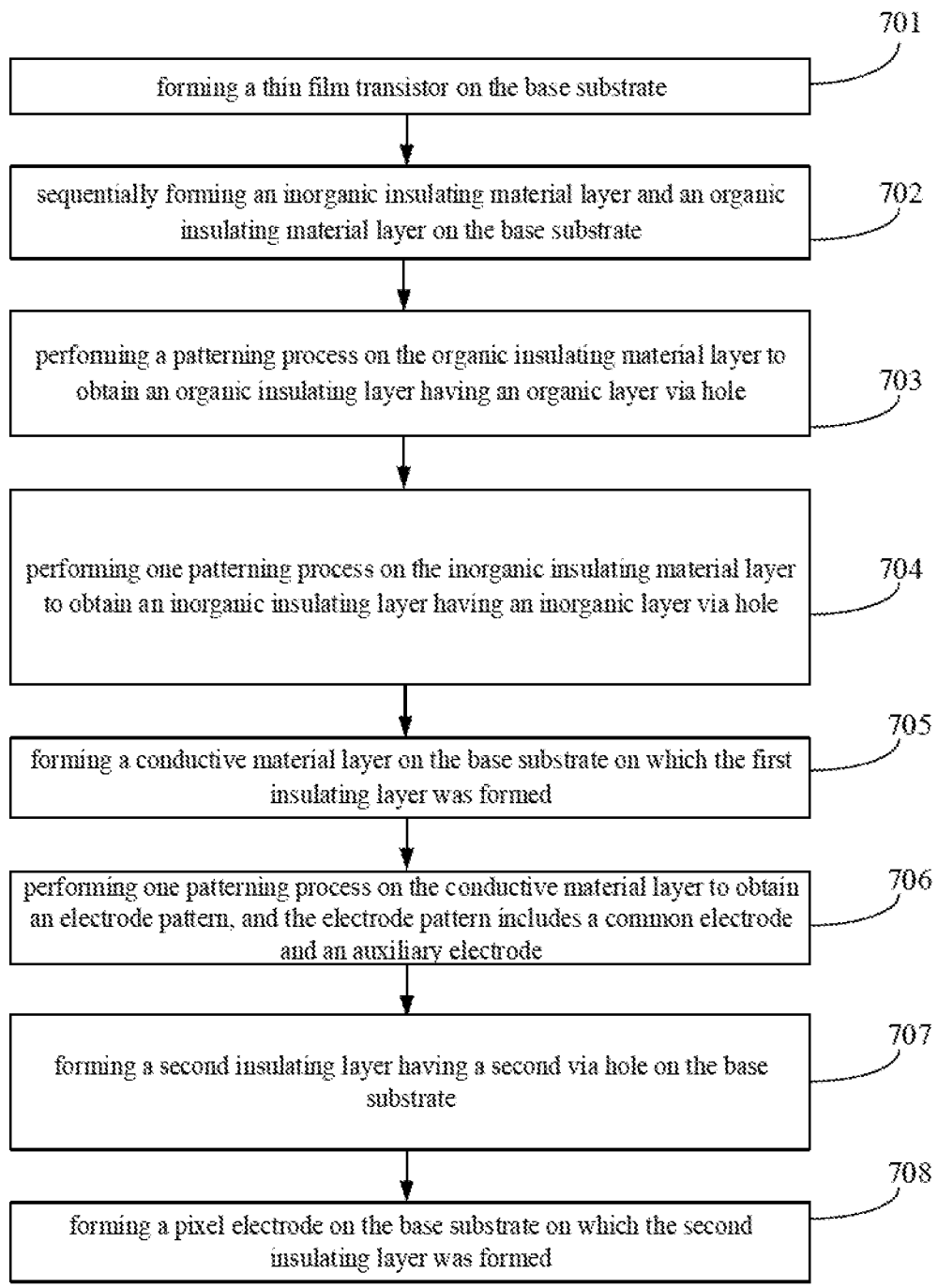
FIG. 8 is a flowchart of a method for manufacturing an array substrate according to one embodiment of the present disclosure.

FIG. 8 is a flowchart of a method for fabricating an array substrate according to one embodiment of the present disclosure. The method for fabricating the array substrate can be used to manufacture the array substrate shown in FIG. 5. As shown in FIG. 8, the manufacturing method of the array substrate may include:

Step 701 includes forming a thin film transistor on the base substrate.

Figure 9:
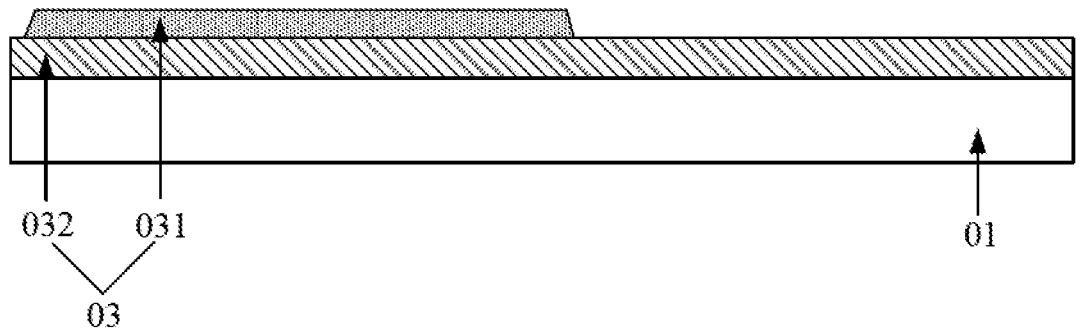
FIG. 9 is a schematic diagram of a partial manufacturing process of an array substrate according to one embodiment of the present disclosure.

The base substrate may also be cleaned before step 701. Then, as shown in FIG. 9, a thin film transistor 03 may be formed on the base substrate 01 in step 701. The thin film transistor 03 may include a gate, a gate-insulating layer 032, an active layer, a source and a drain 031. The material of the gate-insulating layer 03 may include silicon nitride and silicon dioxide.

Step 702 includes sequentially forming an inorganic insulating material layer and an organic insulating material layer on the base substrate on which the thin film transistor was formed.

Figure 10:
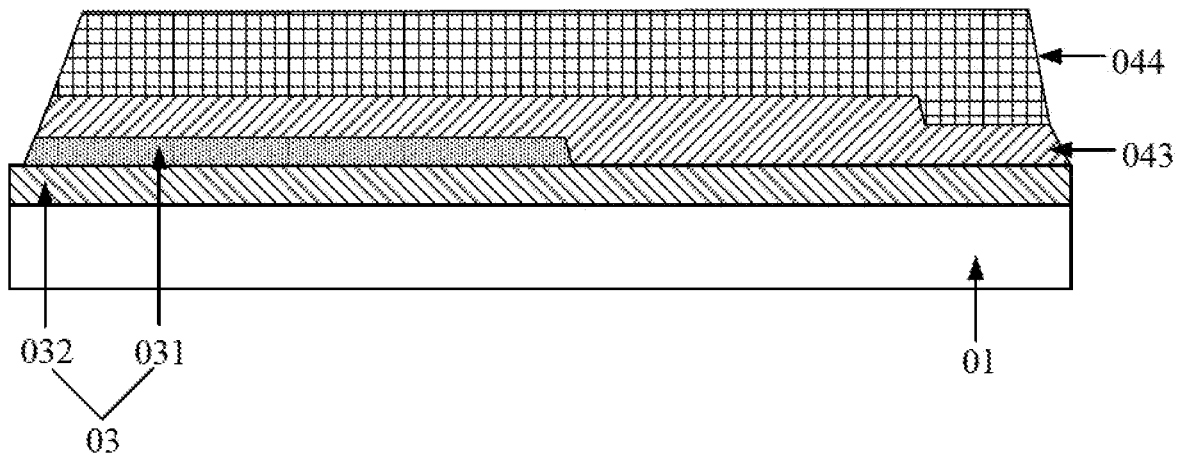
FIG. 10 is a schematic diagram of a partial manufacturing process of an array substrate according to one embodiment of the present disclosure.

As shown in FIG. 10, an inorganic insulating material may be deposited on the base substrate 01 on which the thin film transistor 03 was formed by coating, physical vapor deposition (PVD) or chemical vapor deposition (CVD) to obtain an inorganic insulating material layer 043. Then, an organic insulating material is deposited on the inorganic insulating material layer 043 by a similar method to obtain an organic insulating material layer 044. Wherein, PVD may include the physical deposition methods such as magnetron sputtering or thermal evaporation, and CVD may include a chemical deposition method such as plasma enhanced chemical vapor deposition (PECVD).

Optionally, the inorganic insulating material may be silicon dioxide, and the organic insulating material may be a resin.

Step 703 includes performing a patterning process on the organic insulating material layer to obtain an organic insulating layer having an organic layer via hole.

Figure 11:
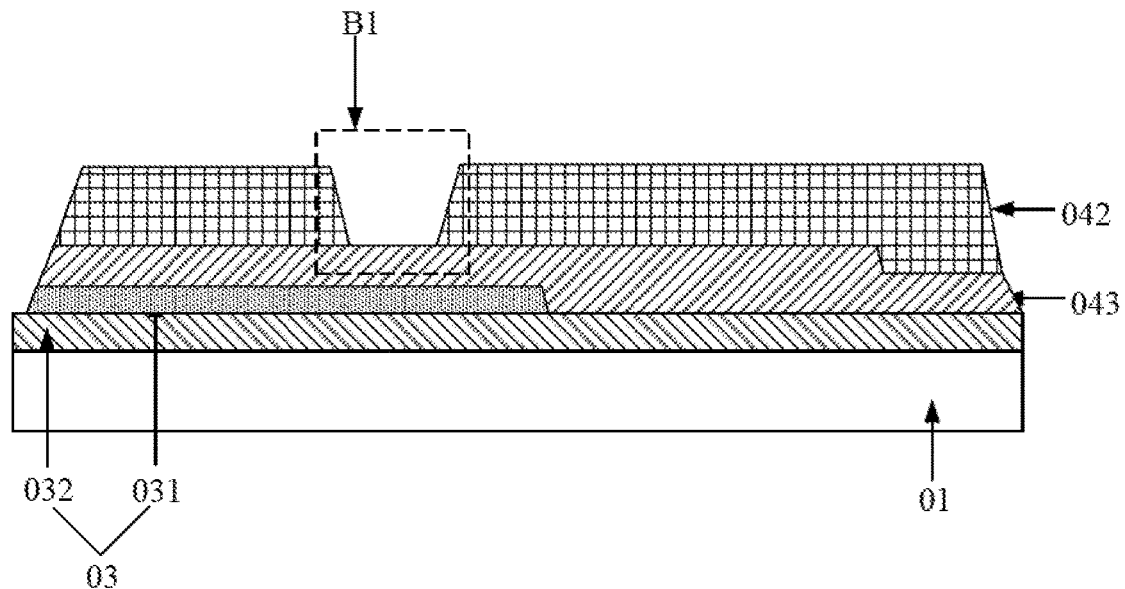
FIG. 11 is a schematic diagram of a partial manufacturing process of an array substrate according to one embodiment of the present disclosure.

As shown in FIG. 11, after the organic insulating material layer 044 is formed, the organic insulating material layer 044 can be processed by one patterning process to form the organic layer via hole B1, thereby obtaining the organic insulating layer 042. The patterning process may include: photoresist coating, exposure, development, etching, and photoresist stripping.

Optionally, the patterning process performed on the organic insulating material layer comprises: coating a layer of photoresist on the organic insulating material layer. Then, the layer if photoresist is exposed with a mask plate to form the exposed region and the non-exposure region of the photoresist. Thereafter, the development process is used to remove the photoresist in one of the exposed region and the non-exposed region, while the photoresist of the other remains. Then, the region of the organic insulating material layer not covered by the photoresist is etched. Finally, after the etching, the photoresist on the organic insulating material layer is striped off to obtain the organic insulating layer.

It should be noted that the photoresist might be a positive photoresist or a negative photoresist. If the photoresist is a positive photoresist, after the above development process, the photoresist in the exposed region is removed, and the photoresist in the non-exposed region is retained. If the photoresist is a negative photoresist, after the above development process, the photoresist in the non-exposed region is removed, and the photoresist in the exposed region remains.

Step 704 includes performing one patterning process on the inorganic insulating material layer to obtain an inorganic insulating layer having an inorganic layer via hole. The organic layer via hole is connected with the inorganic layer via hole, thereby forming the first via hole. The orthographic projection of the first via hole on the base substrate overlaps with the orthographic projection of the drain of the thin film transistor on the base substrate.

Figure 12:
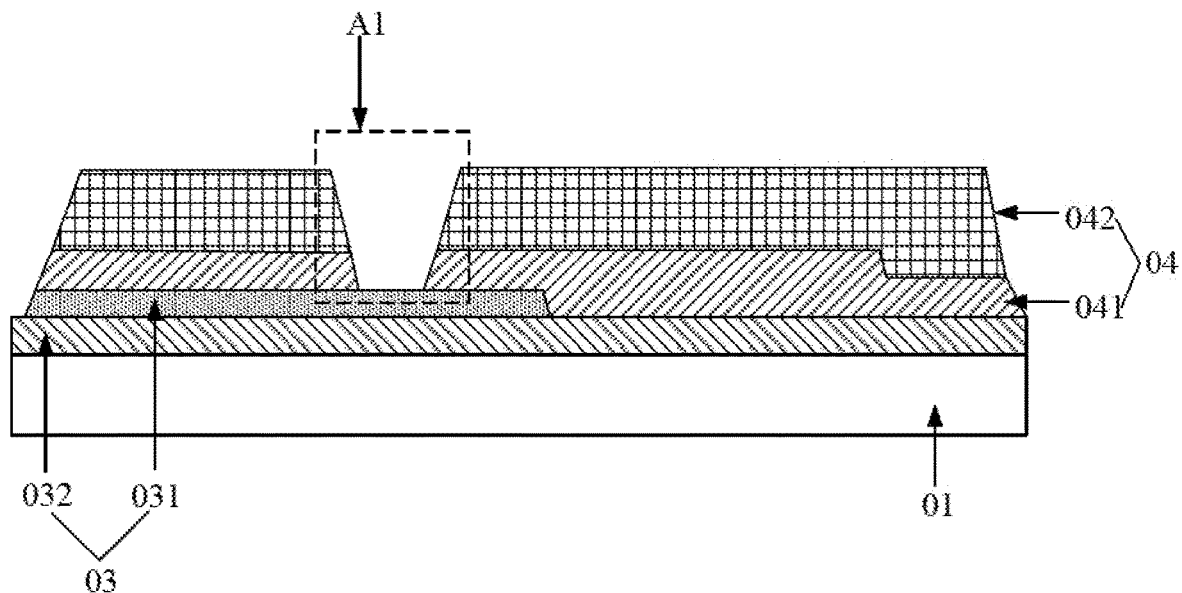
FIG. 12 is a schematic diagram of a partial manufacturing process of an array substrate according to one embodiment of the present disclosure.

Optionally, as shown in FIG. 12, after the organic insulating layer 042 is formed, the inorganic insulating material layer 043 may be treated by one patterning process to form an inorganic layer via hole, thereby obtaining an inorganic insulating layer 041. The organic layer via hole formed in step 703 is connected with the inorganic layer via hole formed in step 704, thereby forming the first via hole. The orthographic projection of the first via hole on the base substrate overlaps with the orthographic projection of the drain of the thin film transistor on the base substrate.

Optionally, the one patterning process includes: photoresist coating, exposure, development, etching, and photoresist stripping. Optionally, the mask used in the one patterning process may be the organic insulating layer formed in step 703. That is, the inorganic insulating material layer is patterned by using the organic insulating layer as a mask, so that only one mask is needed in steps 703 and 704, and there is no need to provide a new one in step 704. Such a process reduces the mask required for the fabrication of the array substrate, thereby reducing manufacturing costs.

Optionally, the inorganic insulating layer may be manufactured by using the organic insulating layer as a mask in step 704, which is not limited in the embodiment of the present disclosure.

Optionally, in a direction perpendicular to the base substrate 01, the thickness of the organic insulating layer 042 may be greater than the thickness of the inorganic insulating layer 041.

Step 705 includes forming a conductive material layer on the base substrate on which the first insulating layer was formed.

Figure 13:
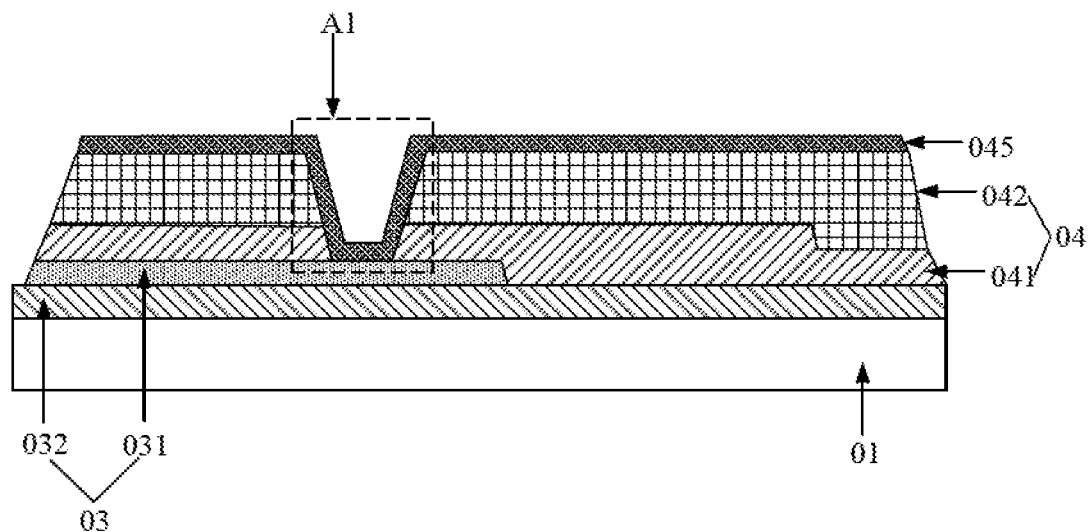
FIG. 13 is a schematic diagram of a partial manufacturing process of an array substrate according to one embodiment of the present disclosure.

Optionally, as shown in FIG. 13, a layer of conductive material may be formed on the base substrate 01 on which the first insulating layer 04 (including the inorganic insulating layer 041 and the organic insulating layer 042) was formed by coating, PVD or CVD to obtain the conductive material layer 045.

Step 706 includes performing one patterning process on the conductive material layer to obtain an electrode pattern, and the electrode pattern includes a common electrode and an auxiliary electrode.

Figure 14:
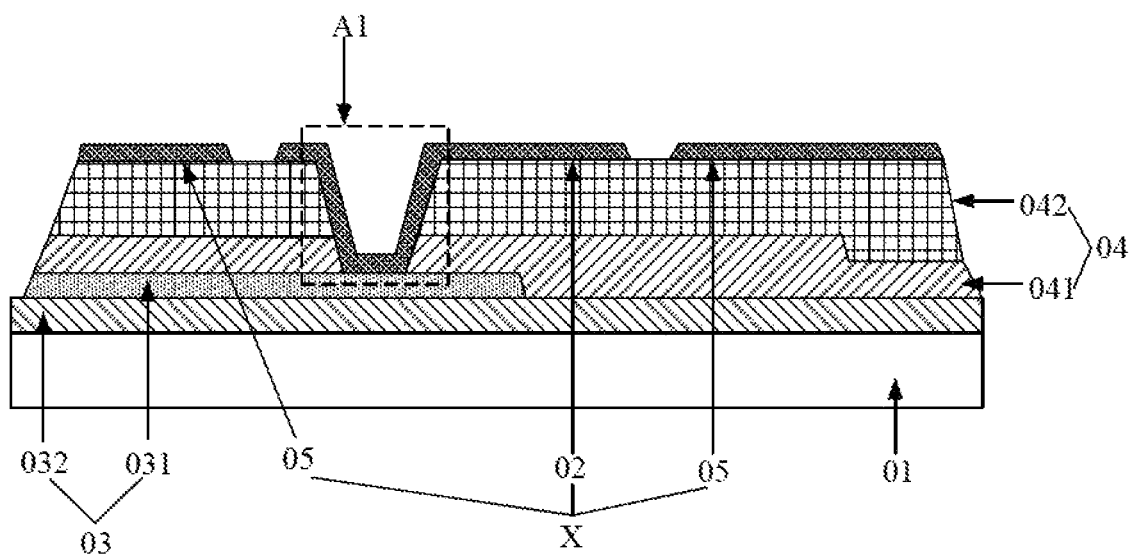
FIG. 14 is a schematic diagram of a partial manufacturing process of an array substrate according to one embodiment of the present disclosure.

Optionally, as shown in FIG. 14, after the conductive material layer 045 is formed, the conductive material layer 045 can be processed by one patterning process to obtain the electrode pattern X. The electrode pattern X includes a common electrode 05 and an auxiliary electrode 02. The auxiliary electrode 02 is coupled to the drain 031 of the thin film transistor 03 through the first via hole A1.

Optionally, the common electrode 05 has a hollowed out region 051 (see FIG. 3), and the orthographic projection of the auxiliary electrode 02 on the base substrate 01 is located within the orthographic projection of the hollowed out region 051 on the base substrate 01. The orthographic projection of the auxiliary electrode 02 on the base substrate 01 has a shape of a first rectangle, and the orthographic projection of the hollowed out region 051 on the base substrate 01 has a shape of a second rectangle. Optionally, the first rectangle and the second rectangle may be similar patterns. That is, a length to width ratio of the first rectangle and a length to width ratio of the second rectangle are the same. In one embodiment, the lengths and widths of the first rectangle are the same as the lengths and widths of the second rectangle, respectively.

Step 707 includes forming a second insulating layer having a second via hole on the base substrate on which the common electrode and the auxiliary electrode were formed, and the orthographic projection of the second via hole on the base substrate overlaps with the orthographic projection of the auxiliary electrode on the base substrate.

Figure 15:
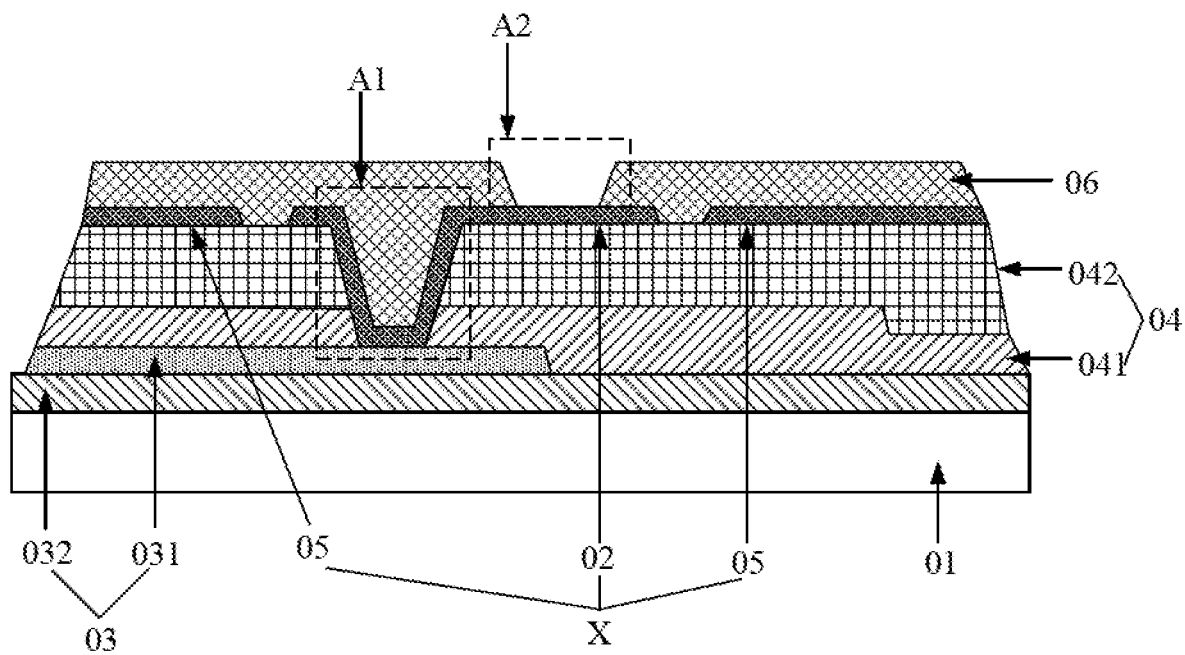
FIG. 15 is a schematic diagram of a partial manufacturing process of an array substrate according to one embodiment of the present disclosure.

Optionally, an insulating material such as silicon nitride may be formed on the base substrate 01 on which the common electrode 05 and the auxiliary electrode 02 were formed by a method such as coating, PVD or CVD to obtain an insulating material layer. Thereafter, the insulating material layer is processed by one patterning process to obtain the second insulating layer 06 having the second via hole A2, as shown in FIG. 15.

Step 708 includes forming a pixel electrode on the base substrate on which the second insulating layer was formed, and the pixel electrode is coupled to the auxiliary electrode through the second via hole.

Optionally, as shown in FIG. 5, after the second insulating layer 06 is formed, the pixel electrode 07 may be formed on the base substrate 01 on which the second insulating layer 06 was formed. The process of forming the pixel electrode 07 can refer to the process of forming the common electrode 05, which will not be described herein.

In the array substrate manufactured by the method provided by some embodiments of the present disclosure, the electrode coupled to the drain is an auxiliary electrode, and the auxiliary electrode is coupled to the drain through the first via hole in the first insulating layer. At this time, the auxiliary electrode is coupled to the drain only through fewer via holes (eg, the first via hole). Therefore, the orthographic projection of the drain on the base substrate is restricted by fewer via holes, and the orthographic projection of the drain on the base substrate can be small. Accordingly, the aperture ratio of the sub-pixel structure in the display panel where the array substrate is located is large.

Optionally, the array substrate shown in FIG. 1 and FIG. 2 may further include an organic insulating layer 16, and the organic insulating layer 16 has an organic layer via hole. When the array substrate shown in FIG. 1 and FIG. 2 is manufactured, the thin film transistor 11 is usually formed on the base substrate 10, and the first insulating material layer, the organic insulating material layer, and the electrode material layer are sequentially formed. Thereafter, a first via hole is formed on the electrode material layer to obtain the common electrode 13. Then, an organic insulating layer 16 is obtained by forming an organic layer via hole in the organic insulating material layer through the first via hole. The organic layer via hole is connected with the first via hole. Then, a second insulating material layer is formed on the base substrate 10 on which the common electrode 13 was formed. Then, the second insulating material layer and the first insulating material layer are simultaneously processed to form a second via hole in the portion of the second insulating material layer that protrudes into the first via hole and the organic layer via hole, thereby obtaining the second insulating layer. At the same time, a third via hole is formed in the first insulating material layer, thereby obtaining the first insulating layer 12.

It can be seen that the second via hole, the third via hole and the organic layer via hole are formed through other via holes. For example, the second via hole and the third via hole are formed through the first via hole and the organic layer via hole. The organic layer via hole is formed through the first via hole. Therefore, the second via hole, the third via hole, and the organic layer via hole are all relatively deep. Additionally, the process of forming via holes in the film layers can include: coating, exposure, development, and etching. Since the second via hole, the third via hole, and the organic layer via hole are all relatively deep, and the first via hole, the second via hole, the third via hole, and the organic layer via hole are all relatively large, the amount of exposure required to form these via holes is large. Moreover, when these via holes are formed, it is easy to etch incompletely, thereby leaving non-etched portion remaining in these via holes. Moreover, in order to increase the pixel aperture ratio as much as possible, the largest via hole (for example, the first via hole) among these via holes is generally made as small as possible. In this way, the second via hole, the third via hole and the organic layer via hole are smaller, so that it is more difficult to form these via holes, and the process margin for forming these via holes is small. That is, the error range allowed in the process of forming these via holes is small. Accordingly, the manufacturing rate of the array substrate is low, and the product yield is low.

In some embodiments of the present disclosure, the organic layer via hole and the second via hole are not formed through other via holes. Therefore, the exposure amount required to form the organic layer via hole and the second via hole in some embodiments of the present disclosure is small. In addition, the inorganic layer via hole is formed by using the organic insulating layer as a mask, so the blocking effect of the organic insulating layer on the light when forming the inorganic layer via hole equals to the blocking effect of the mask used in forming the organic layer via hole. Therefore, the amount of exposure required forming the organic layer via hole equals to the amount of exposure required to form the inorganic layer via hole. As such, the amount of exposure required to form the inorganic layer via hole is also small. Moreover, the positions of the via holes can be easily etched completely when these via holes are formed, thereby avoiding the non-etched portions remaining in the via holes.

Meanwhile, since the organic layer via hole and the second via hole are not formed through other via holes in some embodiments of the present disclosure, therefore, the organic layer via hole and the second via hole can be set larger, thereby ensuring a higher pixel aperture ratio. When the organic layer via hole can be set larger, the inorganic layer via hole can also be set larger, so that it is less difficult to form the organic layer via hole, the inorganic layer via hole and the second via hole, and the process margin is large. As such, the production rate of the array substrate is high, and the product yield is high.

It should be noted that, in some embodiments of the present disclosure, the array substrate shown in FIG. 5 is manufactured as an example. Optionally, the method of manufacturing the array substrate shown in FIG. 3 and FIG. 4 may be similar to the method of manufacturing the array substrate shown in FIG. 5. It is only necessary to change steps 702 to 704 as: forming an insulating material layer (which may be an organic insulating material layer or an inorganic insulating material layer) on the base substrate on which the thin film transistor was formed, and patterning the insulating material layer to obtain a first insulating layer having a first via hole. Optionally, the method of manufacturing the array substrate shown in FIG. 6A and FIG. 6B may be similar to the method of manufacturing the array substrate shown in FIG. 5. Only the position of the second via hole of the second insulating layer is different from the one formed in step 707, and the position of the pixel electrode is different from the one formed in step 708, which are not described herein by the embodiments of the present disclosure.

One embodiment of the present disclosure further provides a display panel, which may include the array substrate provided by any embodiment of the present disclosure (such as the array substrate shown in any of FIG. 3, FIG. 4, FIG. 5, FIG. 6A, and FIG. 6B). Optionally, the display panel may be a liquid crystal display panel, and the display panel may also be other display panels including the aforementioned array substrate, which is not limited in the embodiment of the present disclosure.

One embodiment of the present disclosure further provides a display apparatus, which may include the display panel provided by one embodiment of the present disclosure. For example, the display apparatus may be any product or component having a display function such as an electronic paper, a mobile phone, a tablet computer, a television, a display, a notebook computer, a digital photo frame, a navigator, or the like.

It should be noted that the embodiment of the method provided by the embodiment of the present disclosure could refer to the corresponding embodiment of the array substrate, which is not limited by the embodiment of the present disclosure. The sequence of the steps of the method embodiments of the present disclosure can be appropriately adjusted, and the steps can be correspondingly increased or decreased according to the situation. Any method that can be easily conceived by those skilled in the art within the technical scope of the present disclosure is intended to be included in the scope of the present disclosure and therefore will not be described again.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. An array substrate, comprising:
   a base substrate;
   an auxiliary electrode;

a thin film transistor, a first insulating layer, a first electrode, a second insulating layer, and a second electrode sequentially arranged in a direction away from the base substrate, wherein the auxiliary electrode is between the first insulating layer and the second insulating layer and insulated from the first electrode, the auxiliary electrode is disposed on the first insulating layer and coupled to a drain of the thin film transistor through a first via hole in the first insulating layer, and the second electrode is coupled to the auxiliary electrode through a second via hole in the second insulating layer;

the first electrode is a common electrode disposed on the first insulating layer, the first electrode is between the first insulating layer and the second insulating layer, and the first electrode and the auxiliary electrode are disposed in a first electrode layer;

the thin film transistor includes the drain;

the drain, the first insulating layer, the first electrode layer, and the second insulating layer are stacked next to each other in order;

orthographic projection of the first via hole on the base substrate overlaps orthographic projection of the drain of the thin film transistor on the base substrate, and orthographic projection of the second via hole on the base substrate is located at a side of the orthographic projection of the first via hole away from the thin film transistor;

the orthographic projection of the second via hole on the base substrate covers an area in orthographic projection of a target sidewall on the base substrate, the target sidewall is a sidewall of the first via hole adjacent to the second via hole, and the orthographic projection of the second via hole on the base substrate does not completely cover the orthographic projection of the first via hole on the base substrate;

the second electrode is further coupled to a portion of the auxiliary electrode on the target sidewall through the second via hole; and the orthographic projection of the second via hole on the base substrate comprises an area outside the orthographic projection of the first via hole on the base substrate.

2. The array substrate of claim 1, wherein the second electrode is a pixel electrode.

3. The array substrate of claim 2, wherein the orthographic projection of the second via hole on the base substrate overlaps orthographic projection of the auxiliary electrode on the base substrate.

4. The array substrate of claim 3, wherein the first insulating layer comprises an inorganic insulating layer and an organic insulating layer sequentially arranged in a direction away from the thin film transistor, the organic insulating layer comprises an organic layer via hole, the inorganic insulating layer comprises an inorganic layer via hole, the organic layer via hole is connected with the inorganic layer via hole, and both the organic layer via hole and the inorganic layer via hole constitute the first via hole.

5. The array substrate of claim 4, wherein a thickness of the organic insulating layer is larger than a thickness of the inorganic insulating layer in a direction perpendicular to the base substrate.

6. The array substrate of claim 5, wherein the common electrode comprises a hollowed out region, and the orthographic projection of the auxiliary electrode on the base substrate is within orthographic projection of the hollowed out region on the base substrate.

7. The array substrate of claim 6, wherein the orthographic projection of the auxiliary electrode on the base substrate has a shape of a first rectangle, and the orthographic projection of the hollowed out region on the base substrate has a shape of a second rectangle.

8. The array substrate of claim 1, wherein the common electrode and the auxiliary electrode are in the first electrode layer and made of a same material.

9. A display panel, comprising the array substrate of claim 1.

10. A display apparatus, comprising the display panel according to claim 9.

11. A method of fabricating an array substrate, comprising:

forming a thin film transistor on a base substrate;

forming a first insulating layer having a first via hole on the base substrate on which the thin film transistor was formed, orthographic projection of the first via hole on the base substrate overlapping orthographic projection of a drain of the thin film transistor on the base substrate;

forming a common electrode and an auxiliary electrode insulated from each other on the first insulating layer simultaneously, the auxiliary electrode being coupled to the drain through the first via hole;

forming a second insulating layer having a second via hole on the base substrate on which the common electrode and the auxiliary electrode were formed, orthographic projection of the second via hole on the base substrate overlapping orthographic projection of the auxiliary electrode on the base substrate and the orthographic projection of the second via hole being located at a side of the orthographic projection of the first via hole away from the thin film transistor; and forming a pixel electrode on the base substrate on which the second insulating layer was formed, the pixel electrode being coupled to the auxiliary electrode through the second via hole;

wherein the thin film transistor includes the drain;

the common electrode and the auxiliary electrode are disposed in a first electrode layer;

the drain, the first insulating layer, the first electrode layer, and the second insulating layer are stacked next to each other in order;

the orthographic projection of the second via hole on the base substrate covers an area in orthographic projection of a target sidewall on the base substrate, the target sidewall is a sidewall of the first via hole adjacent to the second via hole, and the orthographic projection of the second via hole on the base substrate does not completely cover the orthographic projection of the first via hole on the base substrate;

the second electrode is further coupled to a portion of the auxiliary electrode on the target sidewall through the second via hole; and the orthographic projection of the second via hole on the base substrate comprises an area outside the orthographic projection of the first via hole on the base substrate.

12. The method of fabricating an array substrate of claim 11, wherein forming the first insulating layer having the first via hole on the base substrate on which the thin film transistor was formed comprises:

forming an inorganic insulating material layer and an organic insulating material layer sequentially on the base substrate on which the thin film transistor was formed;

patterning the organic insulating material layer to obtain an organic insulating layer having an organic layer via hole;

patterning the inorganic insulating material layer to obtain an inorganic insulating layer having an inorganic layer via hole, and the organic layer via hole is connected with the inorganic layer via hole, thereby forming the first via hole.

13. The method of fabricating an array substrate of claim 12, wherein patterning the inorganic insulating material layer is performed by using the organic insulating layer as a mask.

14. The method of fabricating an array substrate of any one of claim 11, wherein forming the common electrode and the auxiliary electrode insulated from each other on the base substrate on which the first insulating layer was formed comprises:

forming a conductive material layer on the base substrate on which the first insulating layer was formed; and patterning the conductive material layer to obtain an electrode pattern, the electrode pattern comprising the common electrode and the auxiliary electrode.

* * * * *